United States Patent
Klein

(10) Patent No.: US 9,611,135 B1
(45) Date of Patent: Apr. 4, 2017

(54) SYSTEM AND METHOD FOR A DIFFERENTIAL COMB DRIVE MEMS

(71) Applicant: Infineon Technologies AG, Neubiberg (DE)

(72) Inventor: Wolfgang Klein, Zorneding (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/928,702

(22) Filed: Oct. 30, 2015

(51) Int. Cl.
| H01L 29/84 | (2006.01) |
| H04R 19/04 | (2006.01) |
| B81B 3/00 | (2006.01) |
| H02N 1/00 | (2006.01) |
| B81C 1/00 | (2006.01) |
| H04R 19/00 | (2006.01) |

(52) U.S. Cl.
CPC ........ B81B 3/0059 (2013.01); B81C 1/00158 (2013.01); H01L 29/84 (2013.01); H02N 1/008 (2013.01); H04R 19/005 (2013.01); H04R 19/04 (2013.01); *B81B 2203/0127* (2013.01); *B81B 2203/0136* (2013.01); *B81C 2201/0197* (2013.01); *H04R 2201/003* (2013.01)

(58) Field of Classification Search
CPC ...... B81B 2201/0257; B81B 2201/033; H01L 29/84; H04R 19/005; H04R 19/04
See application file for complete search history.

(56) References Cited

U.S. PATENT DOCUMENTS

| 7,538,471 | B2 * | 5/2009 | Kurozuka | B81B 3/00 310/309 |
| 8,755,556 | B2 * | 6/2014 | Cohen | B81B 3/0021 381/176 |
| 8,783,113 | B2 * | 7/2014 | Robert | B81B 3/0021 73/700 |
| 8,818,007 | B2 * | 8/2014 | Robert | B06B 1/0292 181/142 |
| 9,131,319 | B2 * | 9/2015 | Zoellin | H04R 23/00 |
| 9,402,137 | B2 * | 7/2016 | Hsu | H04R 19/005 |
| 9,408,555 | B2 * | 8/2016 | Akingba | A61B 5/03 |
| 2008/0170742 | A1 * | 7/2008 | Trusov | G01C 19/5719 381/396 |
| 2013/0152686 | A1 * | 6/2013 | Venkatraman | G01P 15/125 73/514.32 |
| 2015/0021722 | A1 * | 1/2015 | Dehe | H04R 19/005 257/416 |
| 2015/0304777 | A1 * | 10/2015 | Xu | H04R 1/326 381/58 |

* cited by examiner

Primary Examiner — Evan Pert
(74) Attorney, Agent, or Firm — Slater Matsil, LLP

(57) ABSTRACT

According to an embodiment, a MEMS device includes a deflectable membrane including a first plurality of electrostatic comb fingers, a first anchor structure including a second plurality of electrostatic comb fingers interdigitated with a first subset of the first plurality of electrostatic comb fingers, and a second anchor structure including a third plurality of electrostatic comb fingers interdigitated with a second subset of the first plurality of electrostatic comb fingers. The second plurality of electrostatic comb fingers are offset from the first plurality of electrostatic comb fingers in a first direction and the third plurality of electrostatic comb fingers are offset from the first plurality of electrostatic comb fingers in a second direction, where the first direction is different from the second direction.

32 Claims, 10 Drawing Sheets

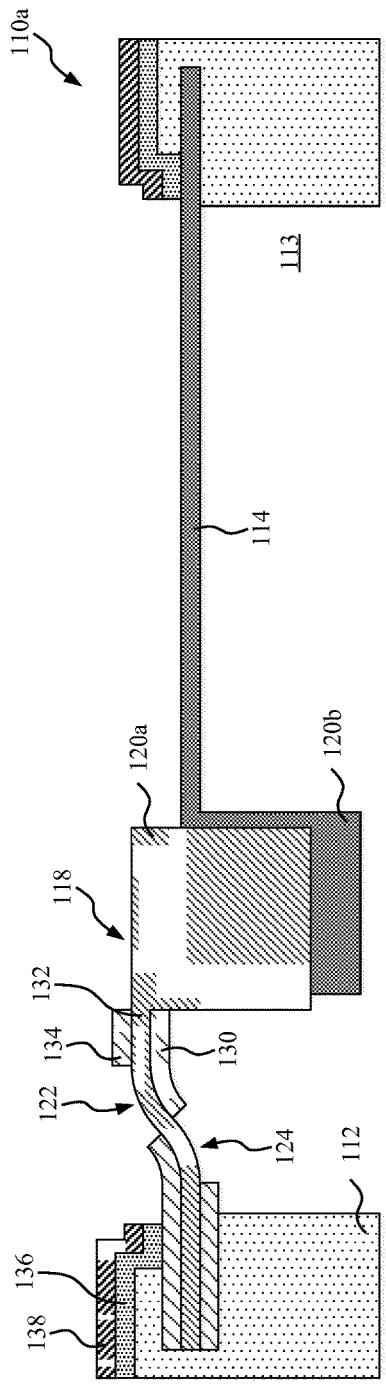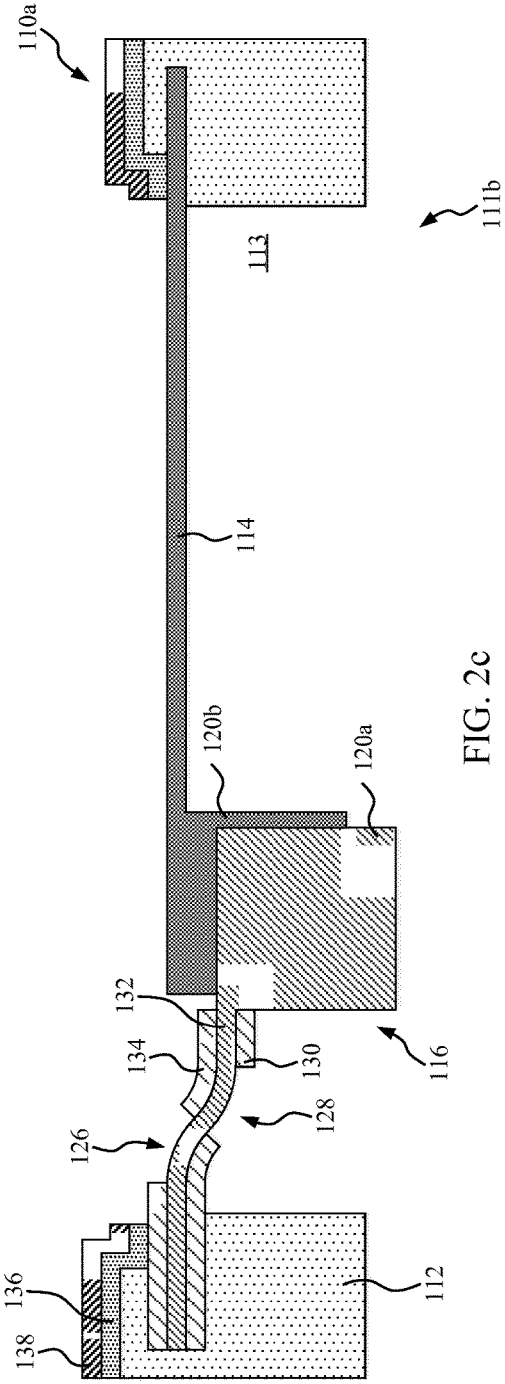
FIG. 2b
FIG. 2c

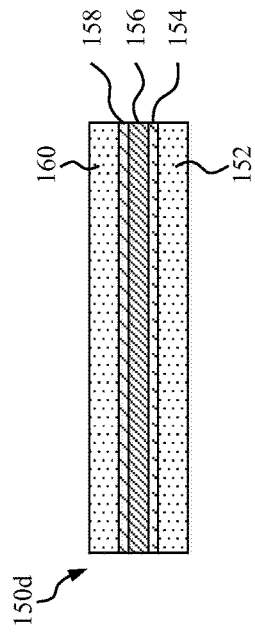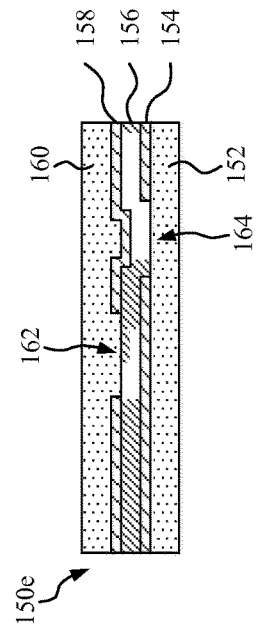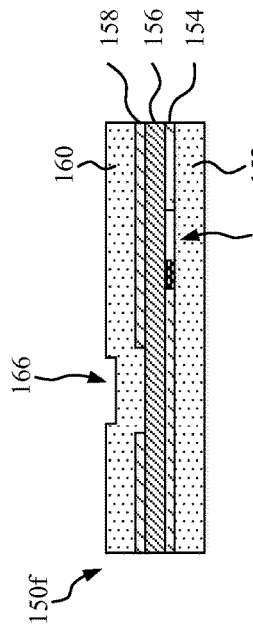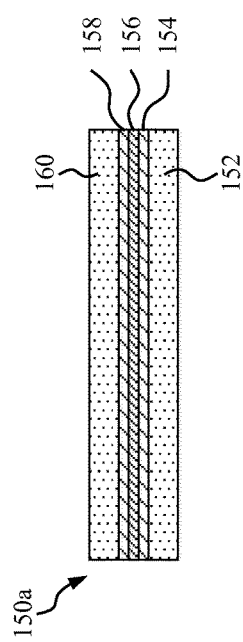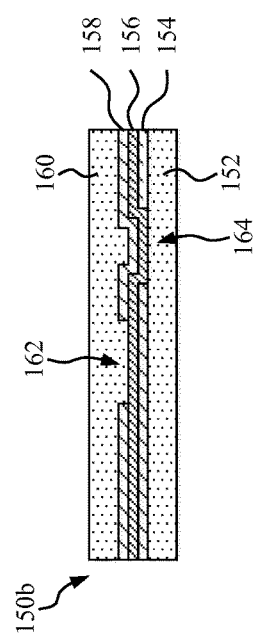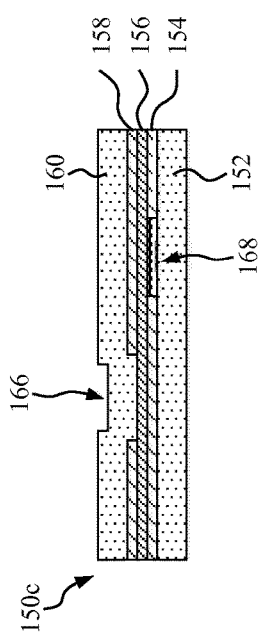

SYSTEM AND METHOD FOR A DIFFERENTIAL COMB DRIVE MEMS

TECHNICAL FIELD

The present invention relates generally to transducers, and, in particular embodiments, to a system and method for a differential comb drive MEMS.

BACKGROUND

Transducers convert signals from one domain to another and are often used in sensors. One common transducer operating as a sensor that is seen in everyday life is a microphone, which converts, i.e., transduces, sound waves into electrical signals. Another example of a common sensor is a thermometer. Various transducers exist that serve as thermometers by transducing temperature signals into electrical signals.

Microelectromechanical system (MEMS) based transducers include a family of sensors and actuators produced using micromachining techniques. MEMS sensors, such as a MEMS microphone, gather information from the environment by measuring the change of physical state in the transducer and transferring a transduced signal to processing electronics that are connected to the MEMS sensor. MEMS devices may be manufactured using micromachining fabrication techniques similar to those used for integrated circuits.

MEMS devices may be designed to function as, for example, oscillators, resonators, accelerometers, gyroscopes, pressure sensors, microphones, and micro-mirrors. Many MEMS devices use capacitive sensing techniques for transducing the physical phenomenon into electrical signals. In such applications, the capacitance change in the sensor is converted to a voltage signal using interface circuits.

One such capacitive sensing device is a MEMS microphone. A MEMS microphone generally has a deflectable membrane separated by a small distance from a rigid backplate. In response to a sound pressure wave incident on the membrane, it deflects towards or away from the backplate, thereby changing the separation distance between the membrane and backplate. Generally, the membrane and backplate are made out of conductive materials and form "plates" of a capacitor. Thus, as the distance separating the membrane and backplate changes in response to the incident sound wave, the capacitance changes between the "plate" and an electrical signal is generated.

MEMS microphones with this type of parallel plate capacitive structure formed from the deflectable membrane and rigid backplate may include various performance characteristics as a consequence of the parallel plate structure. For example, the rigid backplate is often perforated in order to allow air to pass through the backplate so that the rigid backplate is acoustically transparent. However, in practice, the rigid backplate often is not fully acoustically transparent and generates some amount of acoustic noise. This often leads to a tradeoff between mechanical robustness, such as by including fewer and smaller perforations in the rigid backplate, and acoustic noise reduction, such as by including more and larger perforations in the rigid backplate.

Another characteristic of such parallel plate structures is the phenomenon known as "pull-in." In order to operate as an acoustic transducer, a bias voltage is applied between the deflectable membrane and the rigid backplate. Because of the voltage applied between the plates, changes in capacitance between the plates, resulting from motion of the deflectable membrane, produce a measurable voltage signal that corresponds to an incident acoustic signal. However, due to the applied bias voltage, as the separation distance between the deflectable membrane and the rigid backplate decreases, an attractive electrostatic force also increases. The attractive electrostatic force is usually balanced by a restoring mechanical spring force in the deflectable membrane, the attractive electrostatic force increases non-linearly as the distance becomes small while the restoring mechanical spring force increases only linearly. The difference in relation to separation distance results in the attractive electrostatic force overcoming the restoring mechanical spring force when the separation distance reaches a certain limit, which causes pull-in or collapse as the deflectable membrane moves all the way to contact the rigid backplate and may result in stiction. The phenomenon of pull-in presents another tradeoff between resistance to pull-in, from increased rigidity of the deflectable membrane or lower bias voltage, and higher sensitivity, from reduced rigidity of the deflectable membrane or increased bias voltage.

As a further example, dual backplate MEMS microphones are used in order to generate differential signals. Dual backplate MEMS microphones include a deflectable membrane, similar to standard parallel plate microphone, and also include both a top backplate and a bottom backplate above and below, respectively, the deflectable membrane. Thus, as the deflectable membrane moves, the capacitance between the deflectable membrane and one of the two backplates increases while the capacitance between the deflectable membrane and the other of the two backplates decreases. Such structures also exhibit the noise characteristics resulting from perforations in the rigid backplates and are susceptible to the phenomenon of pull-in as described hereinabove.

SUMMARY

According to an embodiment, a MEMS device includes a deflectable membrane including a first plurality of electrostatic comb fingers, a first anchor structure including a second plurality of electrostatic comb fingers interdigitated with a first subset of the first plurality of electrostatic comb fingers, and a second anchor structure including a third plurality of electrostatic comb fingers interdigitated with a second subset of the first plurality of electrostatic comb fingers. The second plurality of electrostatic comb fingers are offset from the first plurality of electrostatic comb fingers in a first direction and the third plurality of electrostatic comb fingers are offset from the first plurality of electrostatic comb fingers in a second direction, where the first direction is different from the second direction.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2a, 2b, and 2c illustrate a top view, a first cross sectional view, and a second cross sectional view of an embodiment transducer;

FIGS. 6a, 6b, 6c, 6d, 6e, and 6f illustrate cross sectional views of portions of embodiment transducers;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely microphone transducers, and more particularly, MEMS microphones. Some of the various embodiments described herein include MEMS transducer systems, MEMS microphone systems, MEMS microphones producing differential signals, and interdigitated comb drive MEMS transducers. In other embodiments, aspects may also be applied to other applications involving any type of transducer according to any fashion as known in the art.

As described hereinabove in the background, various MEMS transducers with parallel plate capacitive structures exhibit certain characteristics and tradeoffs due to the parallel plate structure. According to various embodiments described herein, a MEMS transducer includes a deflectable membrane with a comb drive structure for sensing or actuation. In such embodiments, the MEMS transducer may include the deflectable membrane without any sensing backplate. The MEMS transducer has a comb drive, or comb drives, along one or more edges of the deflectable membrane.

In various embodiments, each comb drive portion includes a first stator, a second stator, and a rotor, each with a plurality of comb fingers. In such embodiments, the first stator is connected to an anchor and offset out-of-plane from the deflectable membrane in a first direction and the second stator is connected to an anchor and offset out-of-plane from the deflectable membrane in a second direction that is opposite the first direction. The rotor is connected to an edge of the membrane.

In such various embodiments, the offsets in the first and second direction, such as downward and upward, for example, may be caused by forming extension or supporting portions of the first stator and the second stator with an internal or intrinsic layer stress. For example, the extension of supporting portions between the comb fingers and the anchor structures may include different material layers with various patterns to produce at rest and unbiased deflection of the first and second stators in different directions, such as upwards and downwards. In such embodiments, by having offsets in different directions of two stators electrostatically coupled to the rotor, embodiment MEMS transducers generate a differential transduced signal based on motion of the comb fingers in the rotor that is part of the deflectable membrane. Further details of specific embodiments are described hereinafter in reference to the figures.

Figure 1:
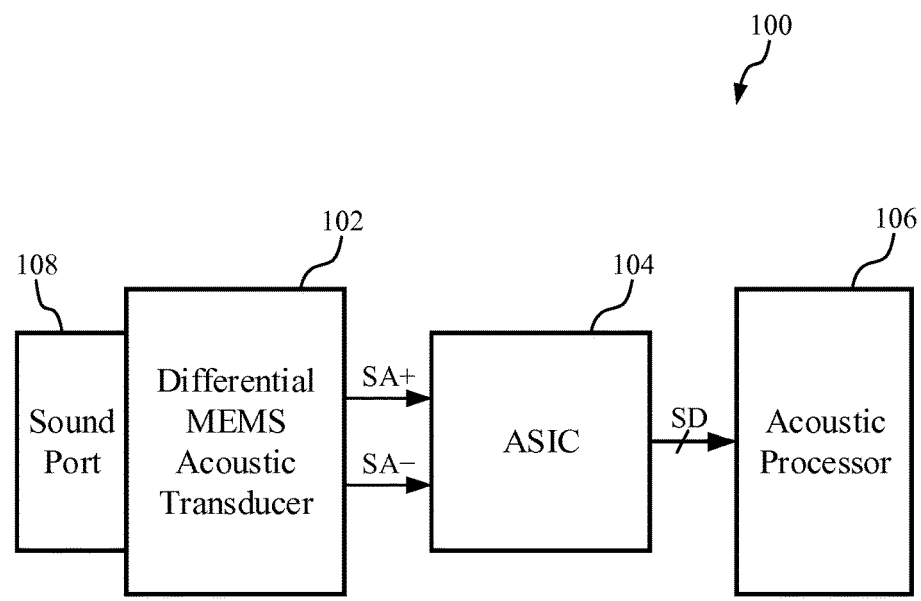
FIG. 1 illustrates a block diagram of an embodiment transducer system.

FIG. 1 illustrates a block diagram of an embodiment transducer system 100 including differential MEMS acoustic transducer 102, application specific integrated circuit (ASIC) 104, and acoustic processor 106. According to various embodiments, differential MEMS acoustic transducer 102 is coupled to an external environment through sound port 108. Acoustic signals transfer through sound port 108 to differential MEMS acoustic transducer 102. In such embodiments, differential MEMS acoustic transducer 102 is fluidically coupled to the external or ambient environment through sound port 108. Acoustic signals are thus transduced at differential MEMS acoustic transducer 102. In various embodiments, acoustic transduction may include generation of acoustic signals from electrical signals, such as through actuation in a MEMS microspeaker, or generation of electrical signal from acoustic signals, such as through sensing in a MEMS microphone.

According to various embodiments, sound waves incident on differential MEMS acoustic transducer 102 through sound port 108 are transduced into a differential signal. In specific embodiments, the differential signal is an analog signal including first analog signal SA+ and second analog signal SA−, which are provided to ASIC 104 for amplification and analog to digital conversion. In such embodiments, ASIC 104 includes an amplification stage and an analog-to-digital converter (ADC). Based on first analog signal SA+ and second analog signal SA−, ASIC 104 generates digital signal SD and provides digital signal SD to acoustic processor 106. In various other embodiments, ASIC 104 includes two amplification stages for generating a differential signal that is provided to acoustic processor 106. In still other embodiments, ASIC 104 includes two amplification stages and two analog-to-digital converters (ADCs) for generating the differential digital signal that is provided to acoustic processor 106. In still further embodiments, ASIC 104 includes two amplification stages and an analog 180° combiner that together generate a single-ended signal that is provided to acoustic processor 106.

In various other embodiments, transducer system 100 may operate as a microspeaker, i.e., in reverse. In such embodiments, acoustic processor 106 generates digital signal SD and provides digital signal SD to ASIC 104, which in turn generates first analog signal SA+ and second analog signal SA− as drive signals for differential MEMS acoustic transducer 102. Based on first analog signal SA+ and second analog signal SA− as drive signals, differential MEMS acoustic transducer 102 generates acoustic signals, e.g., sound waves, which propagates through sound port 108 to the external or ambient environment.

In various embodiments, differential MEMS acoustic transducer 102 includes a MEMS device structure that has a first stator and a second stator electrostatically coupled to a rotor attached to a deflectable membrane. The first stator and the second stator have different positions relative to the rotor in order to generate a differential signal based on motions of the deflectable membrane.

Transducer system 100 may include numerous modifications in different embodiments. For example, certain embodiments include a single integrated circuit (IC) that include differential MEMS acoustic transducer 102 and ASIC 104 integrated on a single die, such as a semiconductor die. In alternative embodiments, differential MEMS acoustic transducer 102 is a digital MEMS microphone that generates a digital signal instead of an analog signal. In some embodiments, acoustic processor 106 is omitted. In specific embodiments, acoustic processor 106 is a custom audio processor. For example, acoustic processor 106 may be a coder/decoder (codec). In various embodiments, ASIC 104 may a fully custom IC, a partially custom IC, or an off-the-shelf IC. In some embodiments, ASIC 104 may provide a bias voltage or bias voltages to differential MEMS acoustic transducer 102. In some further embodiments, ASIC 104 may perform additional functions (not shown), such as calibration, self-test, diagnostic, or repair functions, for example.

Transducer system 100 may be packaged in a plastic, glass, or metal package in some embodiments. Differential MEMS acoustic transducer 102 may be separately packaged in a plastic, glass, or metal microphone package that includes sound port 108. In such embodiments, ASIC 104 may be included in the microphone package or packaged separately. For example, differential MEMS acoustic transducer 102, ASIC 104, and acoustic processor 106 may each be packaged separately and attached to a printed circuit board (PCB) that provides electrical coupling between the components of transducer system 100. In various embodiments, transducer system 100 may be included in a personal mobile device, such as tablet, smart phone, laptop, smartwatch, or other wearable device. In other embodiments, transducer system 100 may be included in larger mobile systems, such as an automotive or other vehicle system, for example. In still other embodiments, transducer system 100 may be included in a non-mobile system, such as a smart home or residential environment or in an industrial setting. In yet further embodiments, transducer system 100 may be included in robotic systems. In other embodiments, transducer system 100 may be included in any type of system.

Figure 2A:
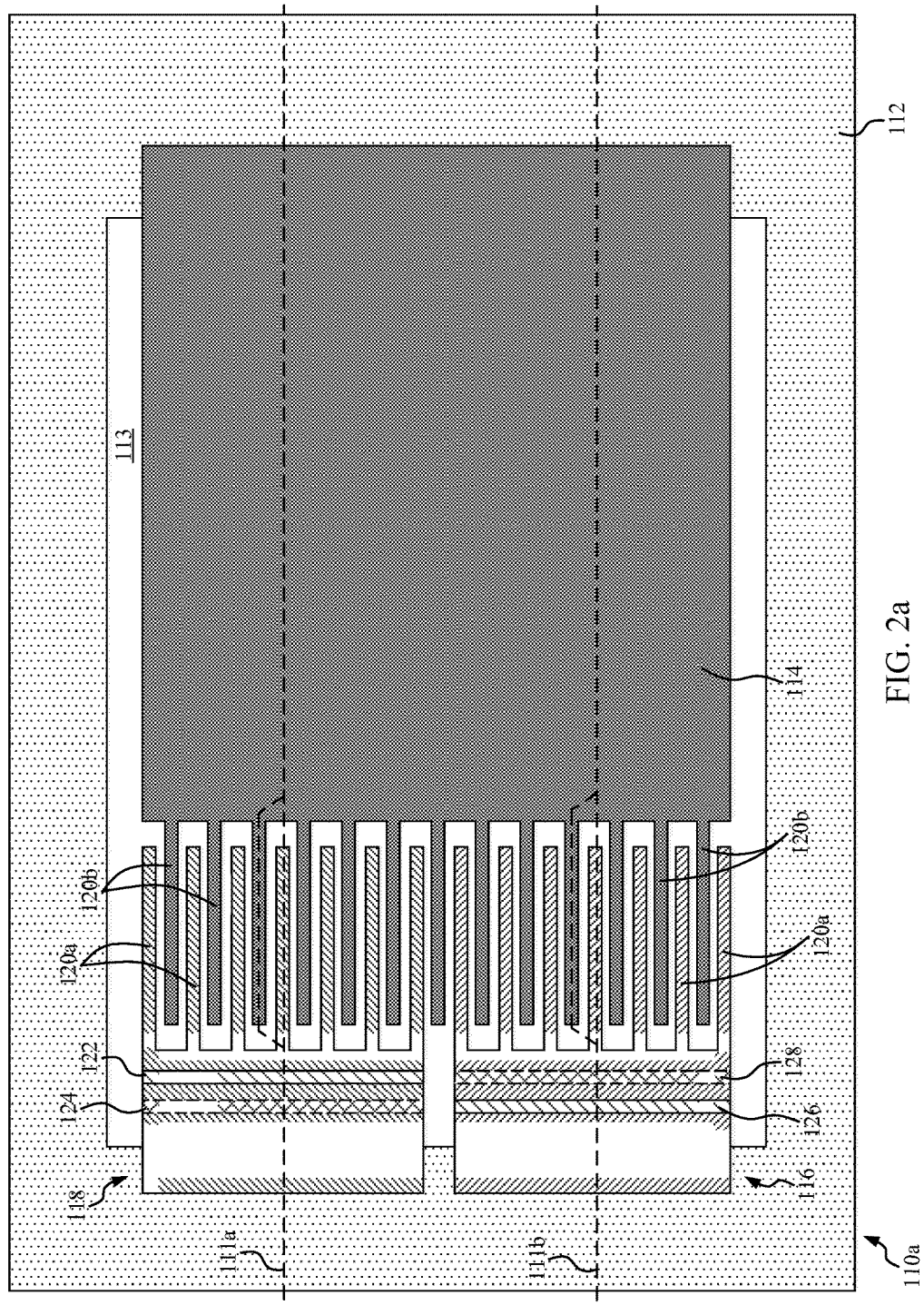

FIGS. 2a, 2b, and 2c illustrate a top view, a first cross sectional view, and a second cross sectional view of an embodiment transducer 110a including substrate 112, membrane 114, negative stator 116, and positive stator 118. FIG. 2a illustrates the top view of transducer 110a, FIG. 2b illustrates the cross sectional view at cross-section 111a, and FIG. 2c illustrates the second cross sectional view at cross-section 111b. According to various embodiments, membrane 114 is a deflectable rectangular flap membrane anchored to substrate 112 along one edge and electrostatically coupled along an opposite edge to negative stator 116 and positive stator 118 through interdigitated comb fingers 120a and interdigitated comb fingers 120b, which operate as an electrostatic comb drive. In such embodiments, positive stator 118 is deflected out-of-plane (referring to a plane including the top surface of membrane 114) in an upward direction as shown at cross-section 111a as illustrated by FIG. 2b, and negative stator 116 is deflected out-of-plane (referring to a plane including the top surface of membrane 114) in a downward direction as shown at cross-section 111b as illustrated by FIG. 2c.

In various embodiments, pressure waves, such as fluidic signals including sound waves, incident on membrane 114 produce deflections of membrane 114. As membrane 114 deflects due to the incident sound waves, for example, the deflections cause the parallel plate capacitance between interdigitated comb fingers 120a and interdigitated comb fingers 120b to change. For example, when an incident sound wave causes membrane 114 to move down, the parallel plate capacitance between interdigitated comb fingers 120a and interdigitated comb fingers 120b increases for negative stator 116 and decreases for positive stator 118. In such embodiments, the plate overlap (as viewed through the cross sectional view of FIG. 2b) between interdigitated comb fingers 120a and interdigitated comb fingers 120b at positive stator 118 decreases as membrane 114 moves downward, leading to the decrease in parallel plate capacitance for positive stator 118. Similarly, the plate overlap (as viewed through the cross sectional view of FIG. 2c) between interdigitated comb fingers 120a and interdigitated comb fingers 120b at negative stator 116 increases as membrane 114 moves downward, leading to the increase in parallel plate capacitance for negative stator 116.

Further, as membrane 114 moves upward, the plate overlap (as viewed through the cross sectional view of FIG. 2b) between interdigitated comb fingers 120a and interdigitated comb fingers 120b at positive stator 118 increases, leading to an increase in parallel plate capacitance for positive stator 118. Similarly, as membrane 114 moves upward, the plate overlap (as viewed through the cross sectional view of FIG. 2c) between interdigitated comb fingers 120a and interdigitated comb fingers 120b at negative stator 116 decreases, leading to a decrease in parallel plate capacitance for negative stator 116.

According to various embodiments, because the parallel plate capacitance for negative stator 116 and positive stator 118 exhibit inverse changes, a differential signal is generated by negative stator 116 and positive stator 118 as membrane 114 deflects. In such embodiments, the differential signal corresponds to the pressure signal, such as acoustic signals for example. The differential signal may be read out as a differential voltage signal from negative stator 116 and positive stator 118 in some embodiments. In some embodiments, membrane 114 may deflect further until the plate overlap between interdigitated comb fingers 120a and interdigitated comb fingers 120b (as viewed through the cross sectional views of FIGS. 2b and 2c) begins to decrease for both negative stator 116 and positive stator 118.

According to alternative embodiments, a voltage signal is applied to interdigitated comb fingers 120a and interdigitated comb fingers 120b in order to generate an electrostatic force on membrane 114 and cause deflections. In such alternative embodiments, membrane 114 may be excited to generate pressure waves, such as sound waves. The electrostatic force is generated by the interaction of interdigitated comb fingers 120a and interdigitated comb fingers 120b operating as an electrostatic comb drive. In such alternative embodiments, transducer 110a may operate as a microspeaker.

In various embodiments, positive stator 118 is deflected at rest upward and negative stator 116 is deflected at rest downward. In such embodiments, interdigitated comb fingers 120a of positive stator 118 are supported by, and electrically coupled to conductive layer 132, which is fixed in substrate 112 on one end. Similarly, interdigitated comb fingers 120a of negative stator 116 are supported by, and electrically coupled to conductive layer 132, which is fixed in substrate 112 on one end. Conductive layer 132 is sandwiched between bottom stress layer 130 and top stress layer 134. In various embodiments, bottom stress layer 130 and top stress layer 134 each include tensile or compressive layer stress that pulls or pushes conductive layer 132 towards one of the stress layers. In regions where bottom stress layer 130 and top stress layer 134 are included below and above, i.e., sandwiching conductive layer 132, the tensile or compressive stress that pulls or pushes conductive layer 132 pulls or pushes equally in both directions. In such embodiments, the deflecting force is balanced and conductive layer 132 does not deflect at rest. In areas where either bottom stress layer 130 or top stress layer 134 is removed, while the other stress layer is included, the force is not balanced and conductive layer 132 deflects or curves towards or away from the respective stress layer that is included, depending on whether the stress is compressive or tensile. The discussion hereinafter refers to bottom stress layer 130 and top stress layer 134 as compressive stress layers.

Specifically, in some embodiments, bottom stress layer 130 for positive stator 118 includes patterned opening 124. In the region above patterned opening 124, conductive layer 132 curves upward toward top stress layer 134. Similarly, top stress layer 134 includes patterned opening 122. In the region below patterned opening 122, conductive layer 132 curves downward toward bottom stress layer 130. In such embodiments, positive stator 118 is deflected upward at rest and without a voltage bias due to the patterning of bottom stress layer 130 or top stress layer 134.

In further specific embodiments, bottom stress layer 130 for negative stator 116 includes patterned opening 128. In the region above patterned opening 128, conductive layer 132 curves upward toward top stress layer 134. Similarly, top stress layer 134 includes patterned opening 126. In the region below patterned opening 126, conductive layer 132 curves downward toward bottom stress layer 130. In such embodiments, negative stator 116 is deflected downward at rest and without a voltage bias due to the patterning of bottom stress layer 130 or top stress layer 134.

In other embodiments, bottom stress layer 130 and top stress layer 134 may include tensile stress. In such embodiments, conductive layer 132 curves in the opposite direction in patterned openings. For example, when bottom stress layer 130 has tensile stress, conductive layer 132 curves upward at patterned opening 122 and downward at patterned opening 124 (opposite as shown). In various embodiments, the type of layer stress may be tensile or compressive, and is dependent on the material used and the method of depositing or forming the material, as will readily be appreciated by those having skill in the art.

In various embodiments, insulating layer 136 and insulating layer 138 are formed in contact with substrate 112. In some embodiments, insulating layer 136 and insulating layer 138 are oxide layers, nitride layers, or oxynitride layers. In a specific embodiment, insulating layer 136 is silicon oxide and insulating layer 138 is silicon nitride. In other embodiments, insulating layer 136 and insulating layer 138 may be other types of dielectric materials. In various embodiments, substrate 112 is a support layer formed on another substrate (not shown; see FIG. 7 for example). Substrate 112 includes cavity 113 below membrane 114. In embodiments where substrate 112 is a supporting layer formed on an additional substrate, cavity 113 may extend into the additional substrate that substrate 112 is formed on top of (not shown; see substrate 174 in FIG. 7 for example). In such embodiments, substrate 112 may be a tetraethyl orthosilicate (TEOS) oxide layer or another insulating structural layer. In some embodiments, substrate 112 or substrate 174 is a semiconductor substrate, such as silicon, silicon germanium, or carbon, for example. In still further embodiments, substrate 112 may be a glass substrate or a plastic substrate.

According to various embodiments, conductive layer 132 may include semiconductor materials or metals. In a specific embodiment, conductive layer 132 is polysilicon. In another embodiment, conductive layer 132 is single-crystal silicon. In an alternative embodiment, conductive layer 132 is aluminum. Similarly, membrane 114 may be formed of the same material and at the same time as conductive layer 132. For example, membrane 114 is formed during a deposition step for forming conductive layer 132.

In various embodiments, bottom stress layer 130 and top stress layer 134 each include an insulating material. In some embodiments, bottom stress layer 130 and top stress layer 134 include an insulating material with a different intrinsic layer stress than conductive layer 132. In a specific embodiment, bottom stress layer 130 and top stress layer 134 are silicon nitride. In other embodiments, bottom stress layer 130 and top stress layer 134 are another type of dielectric material. Further discussion of embodiment materials and methods of fabricating embodiment transducers is provided hereinafter in reference to FIG. 5, for example.

In various embodiments, positive stator 118 is electrically isolated from negative stator 116. Metallization and vias (not shown) may provide electrical connections between separate contacts (not shown) to membrane 114, conductive layer 132 of positive stator 118, and conductive layer 132 of negative stator 116.

In various embodiments, transducer 110a may operate with any type of fluidic medium. In a particular embodiment, transducer 110a, and specifically membrane 114, interacts with air and pressure waves, e.g., sound waves, propagating in the air. In other embodiments, other media with pressure waves may interact with transducer 110a.

As shown in FIGS. 2b and 2c, cross-sections 111a and 111b include a cross-section that is not a straight line for illustration purposes. Specifically, cross-sections 111a and 111b each show one of interdigitated comb fingers 120b. Due to the different position of the interdigitated comb fingers, a straight line cross-section would not pass through both interdigitated comb fingers 120a and interdigitated comb fingers 120b. Thus, this illustration is presented in order to improve understanding. Further, substrate 112 is illustrated as the top layer in FIG. 2a, but substrate 112 may include insulating layer 136 and insulating layer 138 on top of it. Substrate 112 is illustrated in FIG. 2a in order to depict the structural layer that supports membrane 114, positive stator 118, and negative stator 116. In various embodiments, substrate 112 may include metallization, contact pads, and other insulating layers on a top surface of substrate 112.

Figure 3A:
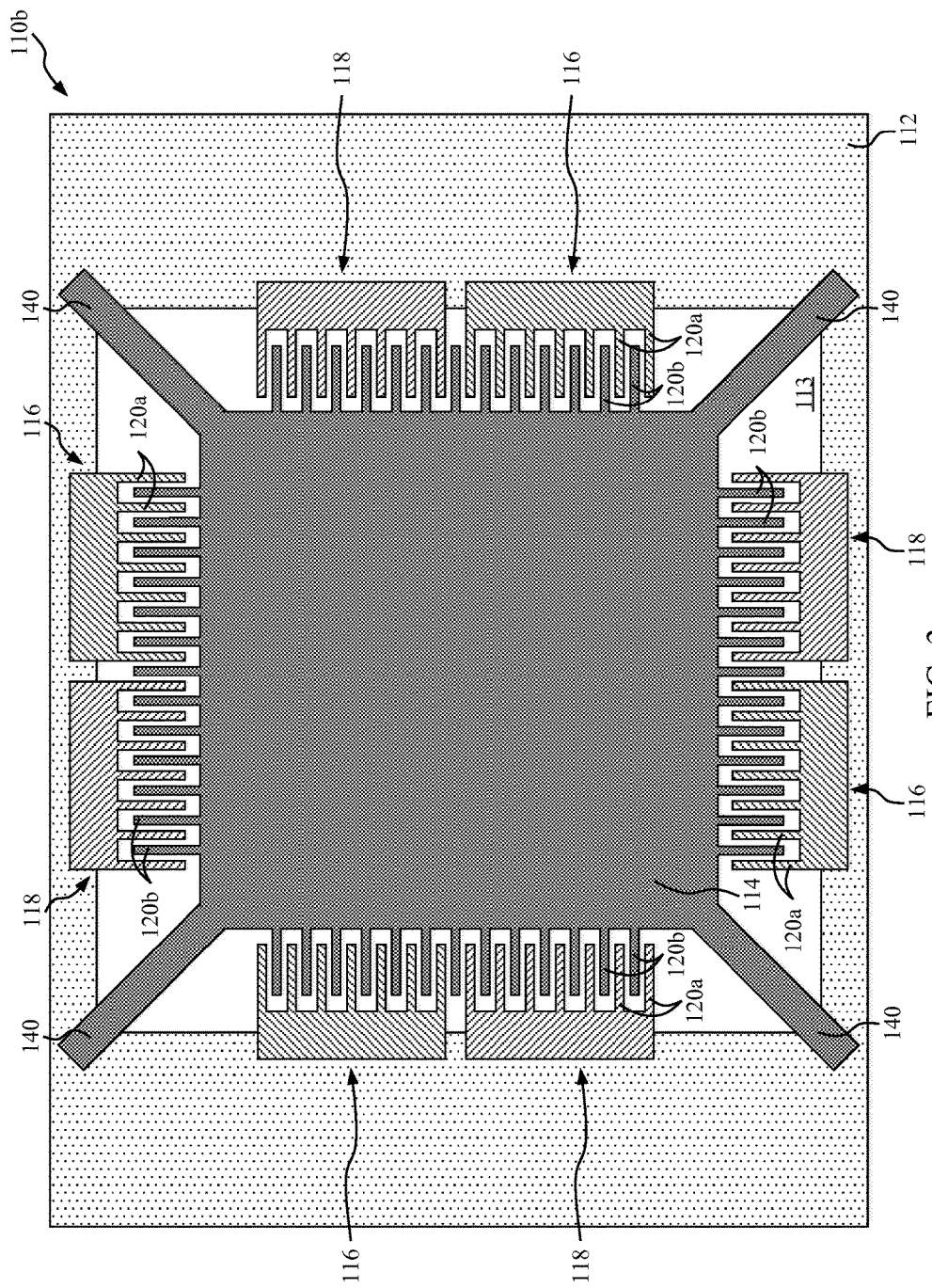
FIGS. 3a and 3b illustrate top views of further embodiment transducers.

FIG. 3a illustrates a top view of another embodiment transducer 110b including substrate 112, membrane 114, negative stator 116, and positive stator 118. According to various embodiments, transducer 110b is similar to transducer 110a described hereinabove in reference to FIGS. 2a, 2b, and 2c, with a different type of membrane 114. In such embodiments, membrane 114 is a square, or rectangular, membrane anchored at each of the four corners by support beams 140. Membrane 114 includes interdigitated comb fingers 120b on each of the four sides. Transducer 110b also includes four instances of negative stator 116, one on each of the four sides, and four instances of positive stator 118, one on each of the four sides, each of the stator structures including interdigitated comb fingers 120a interdigitated with interdigitated comb fingers 120b of membrane 114.

In various embodiments, description of the elements of transducer 110a also applies to similar numbered elements of transducer 110b and will not be repeated in the interest of brevity. Support beams 140 may be formed of the same layer as membrane 114. In other embodiments, support beams 140 may be thicker than the central portion of membrane 114. According to various embodiments, using interdigitated comb fingers 120a and interdigitated comb fingers 120b on all four sides of membrane 114 may increase the sensitivity of transducer 110b.

Figure 3B:
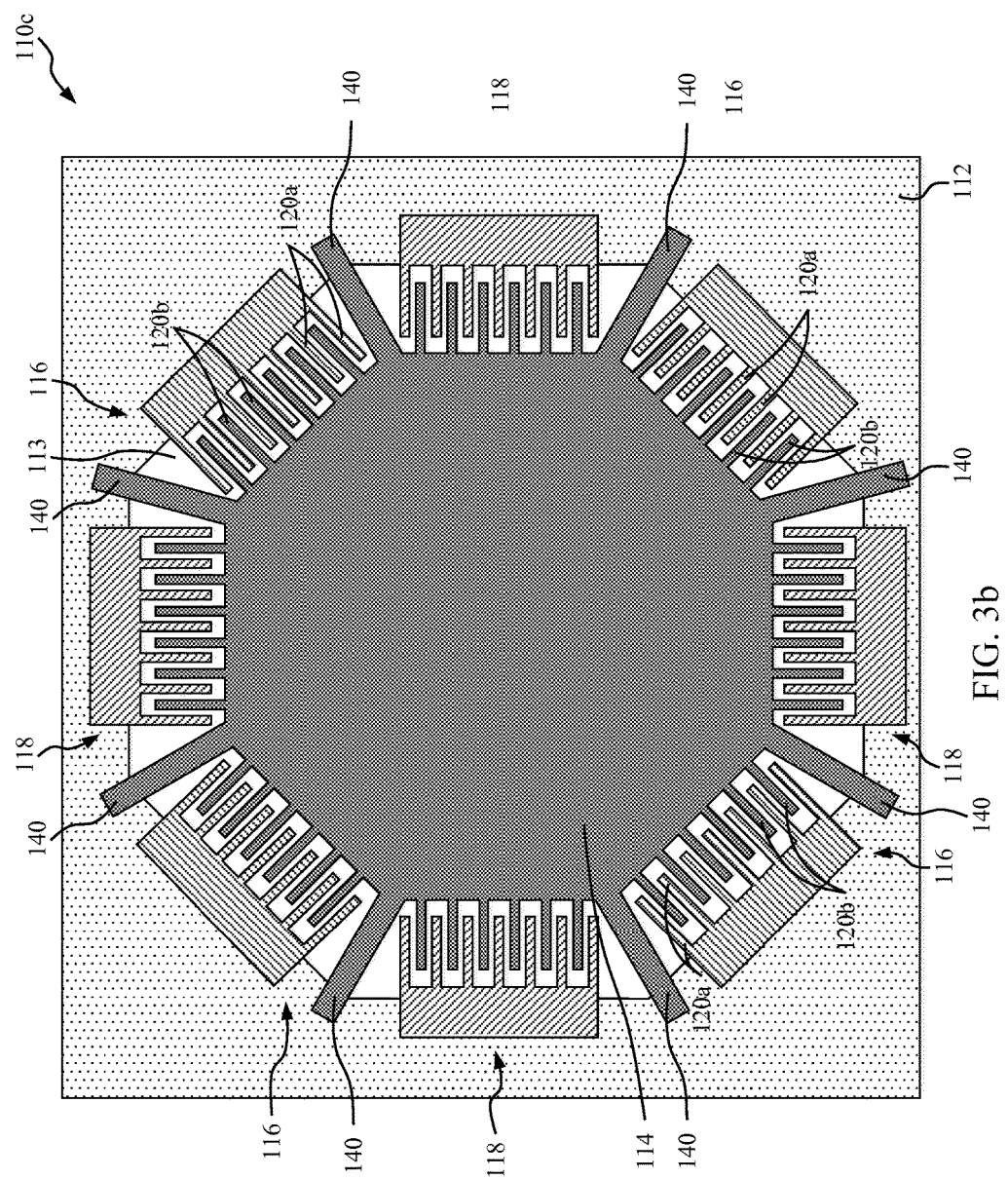

According to various embodiments, embodiment transducers described herein, such as transducer 110b, for example, may have any shape with any configuration of anchors in different embodiments. Specifically, transducer 110b includes a square membrane. According to other embodiments, transducers may have any shape. In particular embodiments, transducers may have a round shape, an oval shape, or a polygon shape. FIG. 3b illustrates a top view of another embodiment transducer 110c as similarly described hereinabove in reference to transducer 110a and transducer 110b in FIGS. 2a, 2b, 2c, and 3a with a specific shape. In such embodiments, membrane 114 is an octagon anchored at each of the eight vertexes by support beams 140. In other embodiments, transducer 110c (and correspondingly cavity 113 and membrane 114) has a shape that may be any type polygon, such as a triangle, square, pentagon, hexagon, heptagon, octagon, and so on. In further embodiments, transducer 110c may have a round shape. Those having skill in the art will readily appreciate that various different shapes may include various configurations of support beams 140 and instances of negative stator 116 and positive stator 118.

Figure 4:
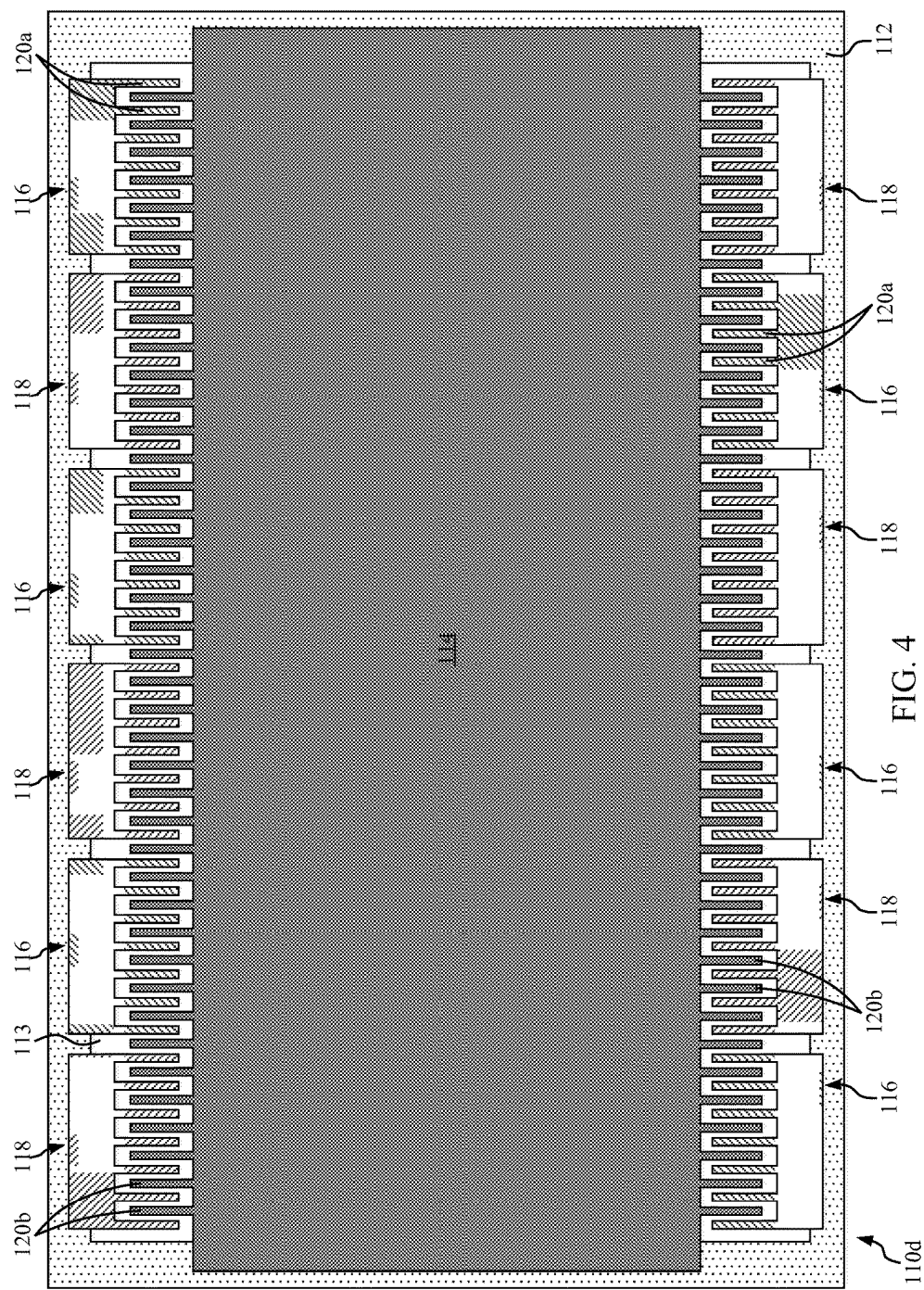
FIG. 4 illustrates a top view of another embodiment transducer.

FIG. 4 illustrates a top view of a further embodiment transducer 110d including substrate 112, membrane 114, negative stator 116, and positive stator 118. According to various embodiments, transducer 110d is similar to transducer 110a described hereinabove in reference to FIGS. 2a, 2b, and 2c, with a different type of membrane 114. In such embodiments, membrane 114 is a square, or rectangular, membrane anchored along two opposite sides. Membrane 114 includes interdigitated comb fingers 120b on the other sides. Transducer 110d also includes six instances of negative stator 116, three on each of two opposite sides, and six instances of positive stator 118, three on each of the two opposite sides, each of the stator structures including interdigitated comb fingers 120a interdigitated with interdigitated comb fingers 120b of membrane 114. In other embodiments, any number of instances of positive stator 118 and negative stator 116 may be included. In various embodiments, positive stator 118 and negative stator 116 may each include 2, 4, 6, 8, 10, 12, 14, 16, 18, or 20 instances, half on each of the two opposite sides. In other specific embodiments, more than 20 instances of positive stator 118 and negative stator 116 may be included. In other specific embodiments, one instance of positive stator 118 covers one side and one instance of negative stator 116 covers the opposite site.

In various embodiments, description of the elements of transducer 110a also applies to similar numbered elements of transducer 110d and will not be repeated in the interest of brevity. According to various embodiments, using interdigitated comb fingers 120a and interdigitated comb fingers 120b on two sides of membrane 114 may increase the sensitivity of transducer 110d. Transducer 110d is shown with interdigitated comb fingers 120a, and correspondingly positive stators 118 and negative stators 116, arranged close to the edge to which membrane 114 is anchored. In other embodiments, interdigitated comb fingers 120a, and correspondingly positive stators 118 and negative stators 116, may be arranged closer to the central region and not near the edges to which membrane 114 is anchored.

Transducer 110a, transducer 110b, transducer 110c, and transducer 110d as illustrated in FIGS. 2a, 2b, 2c, 3a, 3b, and 4 each include positive stator 118, negative stator 116, and membrane 114 with a specific number of interdigitated comb fingers 120a and interdigitated comb fingers 120b. In other embodiments, any number of interdigitated comb fingers 120a and interdigitated comb fingers 120b may be included. In specific embodiments, the number of interdigitated comb fingers 120a and the number of interdigitated comb fingers 120b range from 3 to 100. In general, the number of interdigitated comb fingers 120a is two larger than the number of interdigitated comb fingers 120b for each edge, or vice versa.

Further, in various embodiments, interdigitated comb fingers 120a and interdigitated comb fingers 120b each have a length ranging from 1 µm to 50 µm. Further, the layer thickness of interdigitated comb fingers 120a and interdigitated comb fingers 120b may range from 1 µm to 50 µm. In various embodiments, the width of interdigitated comb fingers 120a and interdigitated comb fingers 120b ranges from 1 µm to 10 µm.

Figure 5:
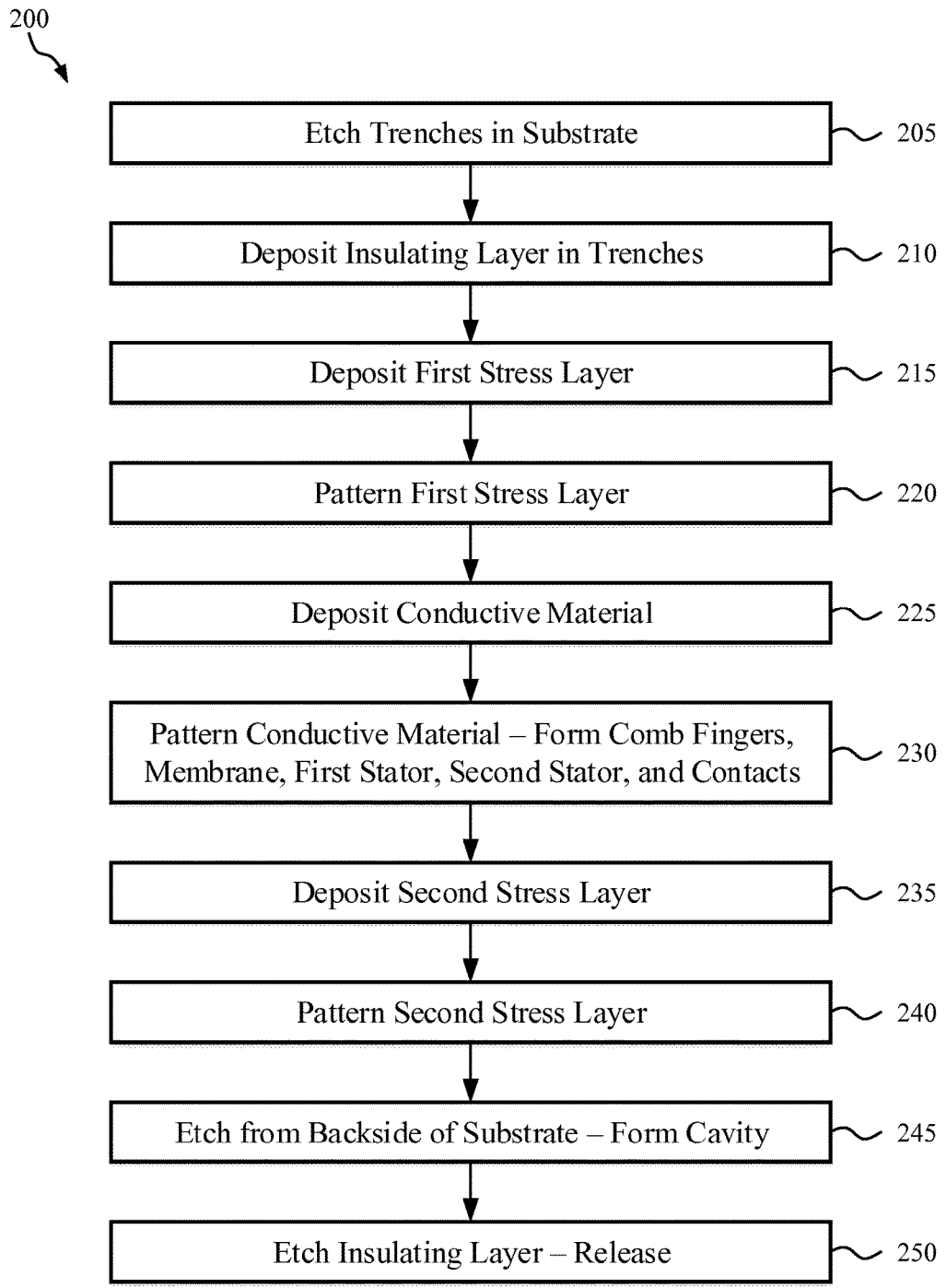
FIG. 5 illustrates a flow chart diagram of an embodiment method of fabrication for an embodiment transducer.

FIG. 5 illustrates a flow chart diagram of an embodiment method of fabrication 200 for an embodiment transducer. Method of fabrication 200 includes steps 205, 210, 215, 220, 225, 230, 235, 240, 245, and 250. According to various embodiments, method of fabrication 200 is a method of forming any of transducer 110a, transducer 110b, transducer 110c, and transducer 110d, for example. In various embodiments, step 205 includes forming trenches in a first main surface of a substrate. The substrate may include a semiconductive material such as silicon or germanium, or a compound semiconductor such as SiGe, GaAs, InP, GaN or SiC. In alternative embodiments, the substrate may include organic materials such as glass or ceramic. The substrate may be a wafer.

The trenches may be etched in a first main surface of the substrate. The trenches may be etched by applying a wet etch chemistry or a dry etch chemistry. For example, the trenches may be etched by applying a reactive ion etch (RIE) process. The trenches may be staggered in order to form both sets of interdigitated comb fingers in a comb drive, such as interdigitated comb fingers 120a and interdigitated comb fingers 120b as described hereinabove in reference to FIGS. 2a, 2b, 2c, 3a, 3b, and 4. The stator is offset from the membrane. Between the trenches etched in the substrate, rims or fins of un-etched material separate the trenches.

In various embodiments, the bottom surface and the sidewalls of the trenches formed in step 205 and the top surface of the substrate are covered with an insulating layer in step 210. Specifically, step 210 includes depositing the insulating layer in the trenches. The insulating layer may include an oxide layer, a nitride layer and/or an oxynitride layer. For example, the insulating layer may be a silicon oxide or a TEOS oxide layer. Alternatively, the insulating layer may be a silicon nitride layer. The insulating layer may be deposited or grown as a conformal layer in step 210. The insulating layer may be deposited such that the insulating layer covers only the bottom surface and the sidewalls of the trenches but not a central portion of the trenches. In some embodiments, the trenches are partially filled with the insulating layer. In some embodiments, the insulating material of the insulating layer may be deposited by applying a chemical vapor deposition (CVD) process, a physical vapor deposition (PVD) process, an atomic layer deposition (ALD) process, or a wet or dry oxidation of the substrate.

According to various embodiments, step 215 includes depositing a first stress layer. The first stress layer may be deposited using any of the processing techniques described in reference to step 210. The first stress layer may include materials deposited with tensile stress or compressive stress. In various embodiments, the first stress layer is a high stress material. In a specific embodiment, the first stress layer is silicon nitride (SiN) having a tensile stress of about 1 GPa. In another specific embodiment, the first stress layer is silicon oxynitride (SiON) having a tensile stress ranging from about 400 MPa to about 800 MPa. In other embodiments, the first stress layer is a low stress material. In a specific embodiment, the first stress layer is TEOS having a compressive stress of about 100 MPa. In another specific embodiment, the first stress layer is silicon (Si) having a compressive stress ranging from about 100 MPa to about 50 MPa, which may depend on the dopant, such as phosphorous (P), implantation, for example. In various embodiments, the first stress layer and the insulating layer may be the same layer.

In various embodiments, step 220 includes patterning the first stress layer formed in step 215. Patterning the first stress layer may include applying a photoresist, developing the photoresist using a mask pattern, and etching the first stress layer in the exposed regions. Etching the first stress layer may include a wet chemistry etch or a dry chemistry etch. The first stress layer may be etched in the trenches and everywhere on the surface of the substrate except between the stator fingers and the substrate. For example, step 220 may include forming patterned opening 124 and patterned opening 128 as described hereinabove in reference to FIGS. 2b and 2c.

Step 225 includes depositing a conductive material in the trenches. The conductive material may be a finger material for the interdigitated comb fingers. In some embodiments, the conductive material may fill the trenches. The conductive material may be a metallic material. The metallic material may comprise a pure metal, an alloy and/or a compound. In some embodiments, the metallic material may, for example, include one or more of the elements chosen from the group consisting of Al, Cu, Ni and Si. Specific embodiments, include pure aluminum, aluminum alloy, aluminum compound, pure copper, copper alloy, copper compound, pure nickel, nickel alloy and nickel compound. In one specific embodiment, the conductive material is AlSiCu. In other embodiments, the conductive material may include a conductive polymer. In still other embodiments, the conductive material includes a doped semiconductor such as doped silicon. The doped silicon may comprise doped polysilicon and/or doped monocrystalline silicon. The doped silicon may be in situ doped.

In various embodiments, the conductive material may be deposited in different ways such as sputtering, PVD, CVD or ALD. The conductive material may be deposited as a single step (for example, the trenches may be filled (e.g. completely filled) or in two or more steps. When the conductive material comprises a metallic material, it is possible that the conductive material is deposited by a galvanic deposition. The conductive material may be directly deposited onto the insulating layer and the first stress layer. In addition to being deposited in the trenches, the conductive layer may also be deposited to form the membrane, such as membrane 114 as described hereinabove in reference to FIGS. 2a, 2b, 2c, 3a, 3b, and 4.

In various embodiments, step 230 includes patterning the conductive material. Patterning the conductive material in step 230 may include forming the interdigitated comb fingers, the membrane, the first stator and second stator (such as positive stator 118 and negative stator 116, respectively, as described hereinabove in reference to FIGS. 2a, 2b, 2c, 3a, 3b, and 4, for example), and the contacts, such as contact pads for example. In such embodiments, step 230 includes depositing a photoresist over the conductive material and structuring the photoresist, such as by developing the photoresist using a mask pattern. The exposed portions of the conductive material are then removed. The conductive material may be etched down to the insulating layer or the first stress layer in certain areas based on the patterned photoresist. In such embodiments, the conductive material formed in the trenches is not removed. The conductive material in the trenches may form fingers, such as interdigitated comb fingers 120a and interdigitated comb fingers 120b. In various embodiments, the conductive material may be removed by applying a wet etch or a dry etch chemistry. For example, when the conductive material includes a semiconductor, e.g., a doped semiconductor such as doped silicon, the conductive material may be etched with KOH or acid solutions of $HNO_3$ and HF. In another embodiment a plasma process with chlorine or fluorine delivered by $SF_6$ or $Cl_2$ may be used to remove the conductive material.

In various embodiments, the etch process of the conductive material may be stopped when the top surface of the insulating layer or the first stress layer is reached. In some embodiments, the etch process is stopped either by end point detection or by timing (the layer thickness of the insulating layer is much less than the depth of the fingers in the trenches. In various embodiments, only the trenches are filled with the conductive material and the first stress layer is deposited after the first conductive material and an additional conductive material is deposited to form the membrane and the stator area or areas.

Step 230 may also include forming contact pads and the membrane. The membrane and the contact pads may be formed in or on the substrate. The contact pads and the membrane include the conductive material. In alternative embodiments, the contact pads may be silicided at the contact pad locations. The silicided pads may formed by forming a metallic material on the conductive material. The metallic material may include one or more of the elements from the group consisting of Ni, Co, and Ti. The conductive material and the metallic material may be annealed to form the silicide. In some embodiments the contact pads are passivated.

Following forming the interdigitated comb fingers and the membrane in step 230, step 235 includes depositing the second stress layer. Depositing the second stress layer in step 235 may include all the features described hereinabove in reference to depositing the first stress layer in step 215. Following depositing the second stress layer in step 235, step 240 includes patterning the second stress layer. Patterning the second stress layer in step 240 may be performed as described hereinabove in reference to step 220. In various embodiments, the second stress layer may be patterned to be removed in the trenches and everywhere on the surface of the substrate except between the stator fingers and the substrate. For example, step 240 may include forming patterned opening 122 and patterned opening 126 as described hereinabove in reference to FIGS. 2b and 2c.

According to various embodiments, step 245 includes etching the substrate from the back surface or backside. In such embodiments, the substrate is etched with a directional etch. For example, the substrate is etched with a Bosch process etch. This backside etch is applied such that the substrate is removed under the membrane formed and patterned in steps 225 and 230 (such as membrane 114 as described hereinabove in reference to FIGS. 2a, 2b, 2c, 3a, 3b, and 4) and such that the substrate remains under the stators. In specific embodiments, the backside etch is stopped by the insulating layer of step 210. In such embodiments, the interdigitated comb fingers are encased in the insulating layer and remain standing and un-etched. In various embodiments, step 245 includes forming the cavity beneath the membrane and the interdigitated comb fingers, such as described hereinabove in reference to cavity 113 in FIGS. 2a, 2b, 2c, 3a, 3b, and 4.

In alternative embodiments, the substrate backside is etched with a wet etch including, for example, KOH. In another embodiment the substrate backside is etched with a combination of dry etch to the level of the trenches and subsequent wet etching with a higher selectivity of the substrate, such as a higher silicon selectivity, for example, versus the etch rate of the insulating layer.

According to various embodiments, step 250 includes removing the insulating layer formed in step 210 using a release etch. In such embodiments, the insulating layer is removed with a wet etch or a dry etch. For example, the insulating layer is etched by applying an HF based solution or vapor. Following step 250, the transducer is released and the membrane, e.g., membrane 114, with the interdigitated comb fingers, e.g., interdigitated comb fingers 120b, is free to move. Further, following the release etch, the stators, such as positive stator 118 and negative stator 116 as described hereinabove in reference to FIGS. 2a, 2b, 2c, 3a, 3b, and 4, may deflect to the at rest position. In specific embodiments, following the release etch, interdigitated comb fingers 120a may deflect to an offset position with respect to interdigitated comb fingers 120b, as described hereinabove. In such embodiments, one, or some, of the stators, e.g., positive stator 118, may deflect upwards and one, or some, of the stators, e.g., negative stator 116, may deflect downwards. In such various embodiments, the stator fingers may be interlocked or interdigitated with the membrane fingers in the membrane. The cavity formed in step 245 is located underneath the membrane so that the membrane can move up and down relative to the stators.

Further modifications to the method of fabrication, including the addition or substitution of process steps will be readily appreciated by those having skill in the art. Additional description of processing steps in reference to interdigitated comb finger transducers is described in co-pending U.S. patent application Ser. No. 13/743,306, filed on Jan. 15, 2013 and entitled "Comb MEMS Device and Method of Making a Comb MEMS Device," which is incorporated herein by reference in its entirety.

FIGS. 6a, 6b, 6c, 6d, 6e, and 6f illustrate cross sectional views of portions of embodiment transducers. According to various embodiments, FIGS. 6a, 6b, 6c, 6d, 6e, and 6f depict extension portions 150a, 150b, 150c, 150d, 150e, and 150f extending from a substrate to interdigitated comb fingers for a stator. For example, extension portions 150a, 150b, 150c, 150d, 150e, and 150f may be considered embodiment implementations of portions extending from substrate 112 to interdigitated comb fingers 120a of positive stator 118 or negative stator 116, as described hereinabove in reference to FIGS. 2a, 2b, 2c, 3a, 3b, and 4. Further, FIGS. 6a, 6b, 6c, 6d, 6e, and 6f are illustrated in order to improve understanding in reference to method of fabrication 200 described hereinabove in reference to FIG. 5.

In various embodiments, extension portions 150a, 150b, 150c, 150d, 150e, and 150f include bottom structural layer 152, bottom stress layer 154, conductive layer 156, top stress layer 158, and top structural layer 160. In some embodiments, bottom structural layer 152 and top structural layer 160 are silicon oxide or TEOS oxide. In other embodiments, bottom structural layer 152 and top structural layer 160 are other types of dielectric material or structural material, such as described hereinabove in reference to the insulating layer of step 210 or the substrate in FIG. 5. Bottom stress layer 154 and top stress layer 158 include any of the materials as described hereinabove in reference to the first stress layer of step 215 and the second stress layer of step 235 in FIG. 5. For example, in a specific embodiment, bottom stress layer 154 and top stress layer 158 are formed of silicon nitride. In various embodiments, conductive layer 156 includes any of the materials as described hereinabove in reference to the conductive material of step 225 in FIG. 5. For example, in a specific embodiment, conductive layer 156 is formed of polysilicon.

According to various embodiments, extension portion 150a includes balanced bottom stress layer 154 and top stress layer 158. The layer stress of bottom stress layer 154 is balanced by the layer stress of top stress layer 158. In such embodiments, the layer stress of bottom stress layer 154 and top stress layer 158 is tensile or compressive. Further, in order to balance the layer stress, the bottom stress layer 154 and top stress layer 158 is about equal.

In various embodiments, extension portion 150b includes patterned opening 164 in bottom stress layer 154 and patterned opening 162 in top stress layer 158. For example, patterned opening 162 and patterned opening 164 may correspond to any of patterned opening 122, patterned opening 124, patterned opening 126, and patterned opening 128. Further, patterned opening 162 and patterned opening 164 may be formed as described hereinabove in reference to step 220 in FIG. 5. As shown, due to patterned opening 164, conductive layer 156 may include a bend or bump at patterned opening. Similarly, due to patterned opening 162, top stress layer 158 may include a bend or bump above patterned opening 164.

In various embodiments, in order to remove the bend or bump in conductive layer 156 and top stress layer 158, extension portion 150c includes fill material 168 in place of patterned opening 164. Fill material 168 may have the same shape as patterned opening 164 and may be formed in the same way, but includes a further step of filling the patterned opening with fill material 168. In such embodiments, fill material 168 is removed during a release etch, such as described hereinabove in reference to step 250 in FIG. 5. Fill material 168 may include an oxide, nitride, or oxynitride in various embodiments. In a specific embodiment fill material 168 is a TEOS oxide. In various embodiments including fill material 168, a chemical mechanical polish (CMP) process may be applied to planarize the surface at intermediate fabrication steps. For example, a CMP process may be applied after forming bottom stress layer 154 with the patterned opening and depositing fill material 168. In various embodiments, dip 166 is a depression, bend, or hole in top structural layer 160 over the patterned opening in top stress layer 158.

According to various embodiments, extension portions 150d, 150e, and 150f correspond to extension portions 150a, 150b, and 150c, but each includes a thicker conductive layer 156. In such embodiments, the description provided hereinabove in reference to extension portions 150a, 150b, and 150c applies to the similarly numbered elements of extension portions 150a, 150b, and 150c and will not be repeated in the interest of brevity. In various embodiments, the thickness of conductive layer 156 may range from 100 nm to 2 µm. In more specific embodiments, the thickness of conductive layer 156 ranges from 200 nm to 800 nm. In a specific embodiment, such as depicted by extension portions 150a, 150b, and 150c, conductive layer 156 has a thickness of 150 nm. In another specific embodiment, such as depicted by extension portions 150d, 150e, and 150f, conductive layer 156 has a thickness of 660 nm.

In various embodiments, the thicknesses of top stress layer 158 and bottom stress layer 154 may range from 50 nm to 1 µm. In more specific embodiments, the thicknesses of top stress layer 158 and bottom stress layer 154 range from 100 nm to 500 nm. In a specific embodiment, such as depicted by extension portions 150a, 150b, 150c, 150d, 150e, and 150f top stress layer 158 and bottom stress layer 154 have thicknesses of 140 nm.

Figure 7:
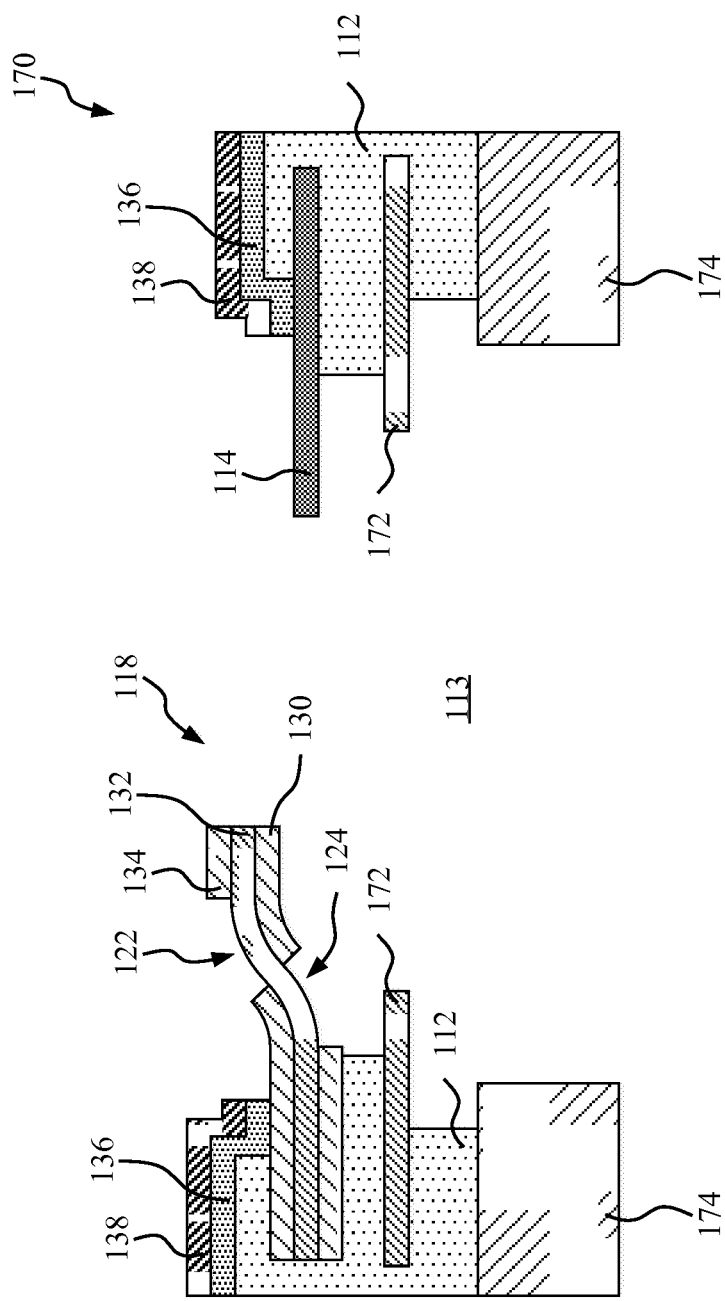
FIG. 7 illustrates a cross sectional view of still another embodiment transducer.

FIG. 7 illustrates a cross sectional view of still another embodiment transducer 170, which is similar to transducer 110a, transducer 110b, transducer 110c, and transducer 110d as described hereinabove in reference to FIGS. 2a, 2b, 2c, 3a, 3b, and 4, with the addition of conductive or isolation layer 172 and substrate 174. Although transducer 170 is shown without the complete membrane 114, interdigitated comb fingers 120a, and interdigitated comb fingers 120b, these elements are included in transducer 170, but are omitted from the drawing in order to simplify the illustration. Specifically, each of the elements described hereinabove in reference to transducer 110a, transducer 110b, transducer 110c, and transducer 110d in FIGS. 2a, 2b, 2c, 3a, 3b, and 4 also applies to similarly numbered elements in FIG. 7.

Substrate 174 may be a semiconductor substrate, such as silicon. In various embodiments, any of the materials described hereinabove in reference to the substrate of method of fabrication 200 in FIG. 5 may also be used for substrate 174. In such embodiments, substrate 112 is a structural material, such as a TEOS oxide that is formed and patterned to support positive stator 118, negative stator 116, and membrane 114. Further, cavity 113 is formed in both substrate 174 and substrate 112 by a backside etch process, such as described hereinabove in reference to step 245 in FIG. 5.

In various embodiments, the backside etch process may form a rough sidewall in substrate 174 and substrate 112 without precisely controlled dimensions, such as a diameter. In such embodiments, conductive layer 172 may be patterned more precisely to clearly define the dimensions of the opening, such as the diameter, in order to more clearly control the electrical characteristics of the fabricated transducer by shielding positive stator 118, negative stator 116, and membrane 114 from the effects of the rough sidewalls in substrate 174 and substrate 112. In some embodiments, conductive layer 172 is polysilicon. In other embodiments, conductive layer 172 is a metal, such as copper, aluminum, gold, or platinum, for example. Conductive layer 172 may include any of the materials described hereinabove in reference to the conductive material of step 225 in FIG. 5. According to various embodiments, conductive layer 172 and substrate 174 may be included in any of the embodiment transducers described herein, such as transducer 110a, transducer 110b, transducer 110c, and transducer 110d, for example.

Figure 8:
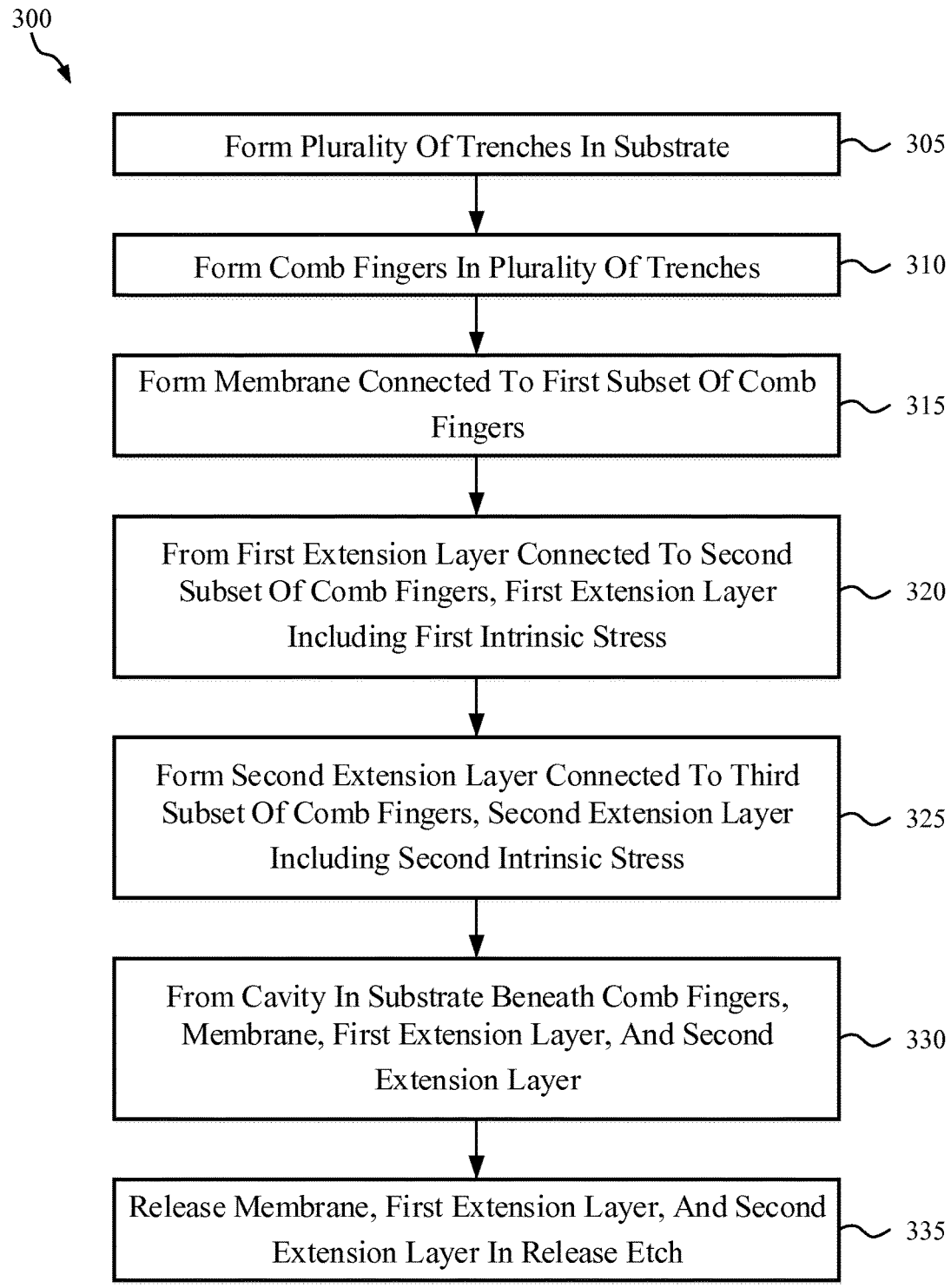
FIG. 8 illustrates a flow chart diagram of another embodiment method of fabrication for an embodiment transducer.

FIG. 8 illustrates a flow chart diagram of another embodiment method of fabrication 300 for an embodiment transducer. Method of fabrication 300 includes steps 305, 310, 315, 320, 325, 330, and 335. According to various embodiments, method of fabrication 300 is a method of forming any of transducer 110a, transducer 110b, transducer 110c, and transducer 110d, for example. In various embodiments, step 305 includes forming a plurality of trenches in a substrate. Step 310 includes forming comb fingers in the plurality of trenches. Following, or simultaneous with, step 310, step 315 includes forming a membrane connected to a first subset of the comb fingers.

In various embodiments, step 320 includes forming a first extension layer connected to a second subset of the comb fingers, where the first extension layer includes a first intrinsic stress. Step 325 includes forming a second extension layer connected to a third subset of the comb fingers, where the second extension layer includes a second intrinsic stress. The first intrinsic stress and the second intrinsic stress may be compressive stress or tensile stress. Further, the first intrinsic stress and the second intrinsic stress may each be affected by patterning in the first extension layer and the second extension layer. For example, the first extension layer and the second extension layer may each include multiple layers and the multiple layers may be patterned to with different patterns in order to produce a layer stresses that cause different at rest deflections of the first extension layer and the second extension layer.

According to various embodiments, step 330 includes forming a cavity in the substrate beneath the comb fingers, the membrane, the first extension layer, and the second extension layer. Step 335 includes releasing the membrane, the first extension layer, and the second extension layer in a release etch. In such embodiments, the first intrinsic stress causes the first extension layer to deflect in a first direction during the release etch and the second intrinsic stress causes the second extension layer to deflect in a second direction during the release etch. The second direction is different from the first direction. For example, the first direction may be upward and the second direction may be downward.

In various embodiments, any of steps 305, 310, 315, 320, 325, 330, and 335 may include details as described hereinabove in reference to method of fabrication 200 in FIG. 5. Further, steps 305, 310, 315, 320, 325, 330, and 335 may modified, substituted, and rearranged based on different embodiments, as will be readily appreciated by those having skill in the art. Additional steps may also be added to method of fabrication 300.

According to an embodiment, a MEMS device includes a deflectable membrane including a first plurality of electrostatic comb fingers, a first anchor structure including a second plurality of electrostatic comb fingers interdigitated with a first subset of the first plurality of electrostatic comb fingers, and a second anchor structure including a third plurality of electrostatic comb fingers interdigitated with a second subset of the first plurality of electrostatic comb fingers. The second plurality of electrostatic comb fingers are offset from the first plurality of electrostatic comb fingers in a first direction and the third plurality of electrostatic comb fingers are offset from the first plurality of electrostatic comb fingers in a second direction, where the first direction is different from the second direction. Other embodiments of this aspect include corresponding systems, apparatus, and processors, each configured to perform embodiment methods.

In various embodiments, the deflectable membrane extends over a first plane and the first direction and the second direction both include an out-of-plane component for the first plane. In some embodiments, the deflectable membrane includes one of a polygon membrane, a round membrane, and an oval membrane. Specifically, the deflectable membrane may include a rectangular membrane. The deflectable membrane may include an octagonal membrane.

In various embodiments, the deflectable membrane is anchored to a support structure along a first edge of the deflectable membrane. In such embodiments, the first plurality of electrostatic comb fingers may be connected to a second edge of the deflectable membrane, where the first edge and the second edge are on opposite sides of the deflectable membrane. In other embodiments, the deflectable membrane is anchored to a first support structure along a first edge of the deflectable membrane and is anchored to a second support structure along a second edge of the deflectable membrane. In still other embodiments, the deflectable membrane is anchored to a first support structure, a second support structure, a third support structure, and a fourth support structure at four corners, respectively, of the deflectable membrane.

In various embodiments, the first anchor structure further includes a first extension portion connected to the second plurality of electrostatic comb fingers, the first extension portion having a first internal stress configured to offset the second plurality of electrostatic comb fingers from the first plurality of electrostatic comb fingers in the first direction, and the second anchor structure further includes a second extension portion connected to the third plurality of electrostatic comb fingers, the second extension portion having a second internal stress configured to offset the third plurality of electrostatic comb fingers from the first plurality of electrostatic comb fingers in the second direction. In such embodiments, the first extension portion includes two material layers configured to generate the first internal stress, and the second extension portion includes two material layers configured to generate the second internal stress. The first extension portion and the second extension portion may include two material layers of a same two materials, where a first material of the same two materials includes polysilicon and a second material of the same two materials includes silicon nitride. In other embodiments, the first extension portion and the second extension portion may include two material layers of a same two materials, where a first material of the same two materials includes a metal and a second material of the same two materials includes an insulator.

In various embodiments, the MEMS device further includes a substrate including a cavity, where the cavity underlies the deflectable membrane. In such embodiments, the MEMS device further includes a support layer formed around the cavity and supporting the deflectable membrane, the first anchor structure, and the second anchor structure. The MEMS device further includes a conductive layer formed in the support layer around the cavity and extending into the cavity in such embodiments.

According to an embodiment, a MEMS device includes a membrane including a diaphragm portion and a first comb finger portion, a first anchor structure, and a second anchor structure. The first comb finger portion includes a first plurality of electrostatic comb fingers. The first anchor structure includes a first anchor portion fixed to a substrate, a first extension portion extending away from the first anchor portion, and a second comb finger portion including a second plurality of electrostatic comb fingers interdigitated with a first subset of the first plurality of electrostatic comb fingers. The first extension portion includes a first material with a first intrinsic stress that causes the first extension portion to deflect in a first direction. The second anchor structure includes a second anchor portion fixed to the substrate, a second extension portion extending away from the second anchor portion, and a third comb finger portion including a third plurality of electrostatic comb fingers interdigitated with a second subset of the first plurality of electrostatic comb fingers. The second extension portion includes a second material with a second intrinsic stress that causes the second extension portion to deflect in a second direction, where the second direction is opposite the first direction. Other embodiments of this aspect include corresponding systems, apparatus, and processors, each configured to perform embodiment methods.

In various embodiments, the diaphragm portion includes one of a polygon diaphragm, a round diaphragm, and an oval diaphragm. Specifically, the diaphragm portion includes an octagonal diaphragm. In another specific embodiment, the diaphragm portion includes a rectangular diaphragm. In such embodiments, the rectangular diaphragm is anchored to a third anchor structure along a first edge of the rectangular diaphragm, and the first comb finger portion is connected to the rectangular diaphragm along a second edge of the rectangular diaphragm, where the first edge is opposite the second edge.

In various embodiments, the first material includes a first plurality of material layers that together have the first intrinsic stress, at least one of the first plurality of material layers being patterned, and the second material includes a second plurality of material layers that together have the second intrinsic stress, at least one of the second plurality of material layers being patterned. In such embodiments, the first plurality of material layers includes a top insulating layer, a middle conductive layer, and a bottom insulating layer, where the top insulating layer and the bottom insulating layer of the first plurality of material layers are patterned according to different mask patterns. Further, in such embodiments, the second plurality of material layers includes a top insulating layer, a middle conductive layer, and a bottom insulating layer, where the top insulating layer and the bottom insulating layer of the second plurality of material layers are patterned according to different mask patterns.

According to an embodiment, a differential MEMS acoustic transducer includes a first anchor, a deflectable membrane, and a first differential electrostatic comb finger drive connected to the deflectable membrane and to the first anchor. The first differential electrostatic comb finger drive includes a plurality of interdigitated electrostatic comb fingers including a first portion with a first offset between the plurality of interdigitated electrostatic comb fingers, and a second portion with a second offset between the plurality of interdigitated electrostatic comb fingers. The first offset is in a different direction than the second offset. Other embodiments of this aspect include corresponding systems, apparatus, and processors, each configured to perform embodiment methods.

In various embodiments, the deflectable membrane includes one of a polygon membrane, a circular membrane, and an oval membrane. Specifically, the deflectable membrane may include a rectangular membrane. In some embodiments, the rectangular membrane includes a rectangular flap membrane anchored to a second anchor on a first edge of the rectangular flap membrane and connected to the first differential electrostatic comb finger drive on a second edge of the rectangular flap membrane.

In various embodiments, the differential MEMS acoustic transducer further includes a second differential electrostatic comb finger drive connected to the deflectable membrane and to a second anchor. In such embodiments, the second differential electrostatic comb finger drive includes a plurality of interdigitated electrostatic comb fingers including a first portion with a first offset between the plurality of interdigitated electrostatic comb fingers, and a second portion with a second offset between the plurality of interdigitated electrostatic comb fingers, where the first offset is in a different direction than the second offset. The rectangular membrane may be anchored to a third anchor on a first edge of the rectangular membrane, anchored to a fourth anchor on a second edge of the rectangular membrane, connected to the first differential electrostatic comb finger drive on a third edge of the rectangular membrane, and connected to the second differential electrostatic comb finger drive on a fourth edge of the rectangular membrane. The second edge is opposite the first edge and the fourth edge is opposite the third edge in such embodiments.

In various embodiments, the differential MEMS acoustic transducer further includes a second differential electrostatic comb finger drive connected to the deflectable membrane and to a second anchor, the second differential electrostatic comb finger drive including a plurality of interdigitated electrostatic comb fingers including a first portion with a first offset between the plurality of interdigitated electrostatic comb fingers, and a second portion with a second offset between the plurality of interdigitated electrostatic comb fingers, where the first offset is in a different direction than the second offset. In such embodiments, the differential MEMS acoustic transducer further includes a third differential electrostatic comb finger drive connected to the deflectable membrane and to a third anchor, the third differential electrostatic comb finger drive including a plurality of interdigitated electrostatic comb fingers including a first portion with a first offset between the plurality of interdigitated electrostatic comb fingers, and a second portion with a second offset between the plurality of interdigitated electrostatic comb fingers, where the first offset is in a different direction than the second offset. In such embodiments, the differential MEMS acoustic transducer further includes a fourth differential electrostatic comb finger drive connected to the deflectable membrane and to a fourth anchor, the fourth differential electrostatic comb finger drive including a plurality of interdigitated electrostatic comb fingers including a first portion with a first offset between the plurality of interdigitated electrostatic comb fingers, and a second portion with a second offset between the plurality of interdigitated electrostatic comb fingers, where the first offset is in a different direction than the second offset. In such embodiments, the rectangular membrane is anchored to a fifth anchor at a first corner of the rectangular membrane, anchored to a sixth anchor at a second corner of the rectangular membrane, anchored to a seventh anchor at a third corner of the rectangular membrane, anchored to an eighth anchor at a fourth corner of the rectangular membrane, connected to the first differential electrostatic comb finger drive on a first edge of the rectangular membrane, connected to the second differential electrostatic comb finger drive on a second edge of the rectangular membrane, connected to the third differential electrostatic comb finger drive on a third edge of the rectangular membrane, and connected to the fourth differential electrostatic comb finger drive on a fourth edge of the rectangular membrane.

According to an embodiment, a method of fabricating a MEMS device includes forming a plurality of trenches in a substrate; forming comb fingers in the plurality of trenches; forming a membrane connected to a first subset of the comb fingers; forming a first extension layer connected to a second subset of the comb fingers, where the first extension layer including a first intrinsic stress; forming a second extension layer connected to a third subset of the comb fingers, where the second extension layer including a second intrinsic stress; forming a cavity in the substrate beneath the comb fingers, the membrane, the first extension layer, and the second extension layer; and releasing the membrane, the first extension layer, and the second extension layer in a release etch. The first intrinsic stress causes the first extension layer to deflect in a first direction during the release etch and the second intrinsic stress causes the second extension layer to deflect in a second direction during the release etch, where the second direction is different from the first direction. Other embodiments of this aspect include corresponding systems, apparatus, and processors, each configured to perform embodiment methods.

In various embodiments, forming comb fingers in the plurality of trenches includes depositing an insulating layer on sidewalls and bottoms of the plurality of trenches and depositing a conductive material in the trenches. In such embodiments, forming the membrane connected to the first subset of the comb fingers may include depositing the conductive material on a flat portion of the substrate during a same deposition step as depositing the conductive material in the trenches and patterning the conductive material on the flat portion of the substrate to form the membrane. In some embodiments, forming the first extension layer and forming the second extension layer include depositing a first insulating layer, patterning the first insulating layer with a first pattern, depositing a first conducting layer, depositing a second insulating layer, and patterning the second insulating layer with a second pattern, where the second pattern is different from the first pattern.

According to some embodiments described herein, advantages of embodiment transducers may include low acoustic noise, low risk of pull-in, differential transduced output signals, high sensitivity levels, and large dynamic range.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectromechanical systems (MEMS) device comprising:
    a deflectable membrane comprising a first plurality of electrostatic comb fingers;
    a first anchor structure comprising a second plurality of electrostatic comb fingers interdigitated with a first subset of the first plurality of electrostatic comb fingers, the second plurality of electrostatic comb fingers offset from the first plurality of electrostatic comb fingers in a first direction; and
    a second anchor structure comprising a third plurality of electrostatic comb fingers interdigitated with a second subset of the first plurality of electrostatic comb fingers, the third plurality of electrostatic comb fingers offset from the first plurality of electrostatic comb fingers in a second direction, the first direction different from the second direction.

2. The MEMS device of claim 1, wherein the deflectable membrane extends over a first plane and the first direction and the second direction both comprise an out-of-plane component for the first plane.

3. The MEMS device of claim 1, wherein the deflectable membrane comprises one of a polygon membrane, a round membrane, and an oval membrane.

4. The MEMS device of claim 3, wherein the deflectable membrane comprises a rectangular membrane.

5. The MEMS device of claim 3, wherein the deflectable membrane comprises an octagonal membrane.

6. The MEMS device of claim 1, wherein the deflectable membrane is anchored to a support structure along a first edge of the deflectable membrane.

7. The MEMS device of claim 6, wherein the first plurality of electrostatic comb fingers is connected to a second edge of the deflectable membrane, wherein the first edge and the second edge are on opposite sides of the deflectable membrane.

8. The MEMS device of claim 1, wherein the deflectable membrane is anchored to a first support structure along a first edge of the deflectable membrane and is anchored to a second support structure along a second edge of the deflectable membrane.

9. The MEMS device of claim 1, wherein the deflectable membrane is anchored to a first support structure, a second support structure, a third support structure, and a fourth support structure at four corners, respectively, of the deflectable membrane.

10. The MEMS device of claim 1, wherein
the first anchor structure further comprises a first extension portion connected to the second plurality of electrostatic comb fingers, the first extension portion having a first internal stress configured to offset the second plurality of electrostatic comb fingers from the first plurality of electrostatic comb fingers in the first direction, and
the second anchor structure further comprises a second extension portion connected to the third plurality of electrostatic comb fingers, the second extension portion having a second internal stress configured to offset the third plurality of electrostatic comb fingers from the first plurality of electrostatic comb fingers in the second direction.

11. The MEMS device of claim 10, wherein
the first extension portion comprises two material layers configured to generate the first internal stress, and
the second extension portion comprises two material layers configured to generate the second internal stress.

12. The MEMS device of claim 11, wherein the first extension portion and the second extension portion comprise two material layers of a same two materials, a first material of the same two materials comprising polysilicon and a second material of the same two materials comprising silicon nitride.

13. The MEMS device of claim 11, wherein the first extension portion and the second extension portion comprise two material layers of a same two materials, a first material of the same two materials comprising a metal and a second material of the same two materials comprising an insulator.

14. The MEMS device of claim 1, further comprising a substrate comprising a cavity, the cavity underlying the deflectable membrane.

15. The MEMS device of claim 14, further comprising:
a support layer formed around the cavity and supporting the deflectable membrane, the first anchor structure, and the second anchor structure; and
a conductive layer formed in the support layer around the cavity and extending into the cavity.

16. A microelectromechanical systems (MEMS) device comprising:
a membrane comprising a diaphragm portion and a first comb finger portion, the first comb finger portion comprising a first plurality of electrostatic comb fingers;
a first anchor structure comprising:
a first anchor portion fixed to a substrate,
a first extension portion extending away from the first anchor portion, the first extension portion comprising a first material with a first intrinsic stress that causes the first extension portion to deflect in a first direction, and
a second comb finger portion comprising a second plurality of electrostatic comb fingers interdigitated with a first subset of the first plurality of electrostatic comb fingers; and
a second anchor structure comprising:
a second anchor portion fixed to the substrate,
a second extension portion extending away from the second anchor portion, the second extension portion comprising a second material with a second intrinsic stress that causes the second extension portion to deflect in a second direction, the second direction opposite the first direction, and
a third comb finger portion comprising a third plurality of electrostatic comb fingers interdigitated with a second subset of the first plurality of electrostatic comb fingers.

17. The MEMS device of claim 16, wherein the diaphragm portion comprises one of a polygon diaphragm, a round diaphragm, and an oval diaphragm.

18. The MEMS device of claim 17, wherein the diaphragm portion comprises an octagonal diaphragm.

19. The MEMS device of claim 17, wherein the diaphragm portion comprises a rectangular diaphragm.

20. The MEMS device of claim 19, wherein
the rectangular diaphragm is anchored to a third anchor structure along a first edge of the rectangular diaphragm, and
the first comb finger portion is connected to the rectangular diaphragm along a second edge of the rectangular diaphragm, the first edge opposite the second edge.

21. The MEMS device of claim 16, wherein
the first material comprises a first plurality of material layers that together have the first intrinsic stress, at least one of the first plurality of material layers being patterned, and
the second material comprises a second plurality of material layers that together have the second intrinsic stress, at least one of the second plurality of material layers being patterned.

22. The MEMS device of claim 21, wherein
the first plurality of material layers comprises a top insulating layer, a middle conductive layer, and a bottom insulating layer, the top insulating layer and the bottom insulating layer of the first plurality of material layers being patterned according to different mask patterns, and
the second plurality of material layers comprises a top insulating layer, a middle conductive layer, and a bottom insulating layer, the top insulating layer and the bottom insulating layer of the second plurality of material layers being patterned according to different mask patterns.

23. A differential microelectromechanical systems (MEMS) acoustic transducer comprising:
a first anchor;
a deflectable membrane; and
a first differential electrostatic comb finger drive connected to the deflectable membrane and to the first anchor, the first differential electrostatic comb finger drive comprising a plurality of interdigitated electrostatic comb fingers comprising a first portion with a first offset between the plurality of interdigitated electrostatic comb fingers, and a second portion with a second offset between the plurality of interdigitated electrostatic comb fingers, wherein the first offset is in a different direction than the second offset.

24. The differential MEMS acoustic transducer of claim 23, wherein the deflectable membrane comprises one of a polygon membrane, a circular membrane, and an oval membrane.

25. The differential MEMS acoustic transducer of claim 23, wherein the deflectable membrane comprises a rectangular membrane.

26. The differential MEMS acoustic transducer of claim 25, wherein the rectangular membrane comprises a rectangular flap membrane anchored to a second anchor on a first edge of the rectangular flap membrane and connected to the first differential electrostatic comb finger drive on a second edge of the rectangular flap membrane.

27. The differential MEMS acoustic transducer of claim 25, further comprising a second differential electrostatic comb finger drive connected to the deflectable membrane and to a second anchor, the second differential electrostatic comb finger drive comprising:
a plurality of interdigitated electrostatic comb fingers comprising a first portion with a first offset between the plurality of interdigitated electrostatic comb fingers, and a second portion with a second offset between the plurality of interdigitated electrostatic comb fingers, wherein the first offset is in a different direction than the second offset, and
wherein the rectangular membrane is
anchored to a third anchor on a first edge of the rectangular membrane,
anchored to a fourth anchor on a second edge of the rectangular membrane, the second edge opposite the first edge,
connected to the first differential electrostatic comb finger drive on a third edge of the rectangular membrane, and
connected to the second differential electrostatic comb finger drive on a fourth edge of the rectangular membrane, the fourth edge opposite the third edge.

28. The differential MEMS acoustic transducer of claim 25, further comprising:
a second differential electrostatic comb finger drive connected to the deflectable membrane and to a second anchor, the second differential electrostatic comb finger drive comprising a plurality of interdigitated electrostatic comb fingers comprising a first portion with a first offset between the plurality of interdigitated electrostatic comb fingers, and a second portion with a second offset between the plurality of interdigitated electrostatic comb fingers, wherein the first offset is in a different direction than the second offset;
a third differential electrostatic comb finger drive connected to the deflectable membrane and to a third anchor, the third differential electrostatic comb finger drive comprising a plurality of interdigitated electrostatic comb fingers comprising a first portion with a first offset between the plurality of interdigitated electrostatic comb fingers, and a second portion with a second offset between the plurality of interdigitated electrostatic comb fingers, wherein the first offset is in a different direction than the second offset; and
a fourth differential electrostatic comb finger drive connected to the deflectable membrane and to a fourth anchor, the fourth differential electrostatic comb finger drive comprising a plurality of interdigitated electrostatic comb fingers comprising a first portion with a first offset between the plurality of interdigitated electrostatic comb fingers, and a second portion with a second offset between the plurality of interdigitated electrostatic comb fingers, wherein the first offset is in a different direction than the second offset, and
wherein the rectangular membrane is
anchored to a fifth anchor at a first corner of the rectangular membrane,
anchored to a sixth anchor at a second corner of the rectangular membrane,
anchored to a seventh anchor at a third corner of the rectangular membrane,
anchored to an eighth anchor at a fourth corner of the rectangular membrane,
connected to the first differential electrostatic comb finger drive on a first edge of the rectangular membrane,
connected to the second differential electrostatic comb finger drive on a second edge of the rectangular membrane,
connected to the third differential electrostatic comb finger drive on a third edge of the rectangular membrane, and
connected to the fourth differential electrostatic comb finger drive on a fourth edge of the rectangular membrane.

29. A method of fabricating a microelectromechanical systems (MEMS) device, the method comprising:
forming a plurality of trenches in a substrate;
forming comb fingers in the plurality of trenches;
forming a membrane connected to a first subset of the comb fingers;
forming a first extension layer connected to a second subset of the comb fingers, the first extension layer comprising a first intrinsic stress;
forming a second extension layer connected to a third subset of the comb fingers, the second extension layer comprising a second intrinsic stress;
forming a cavity in the substrate beneath the comb fingers, the membrane, the first extension layer, and the second extension layer; and
releasing the membrane, the first extension layer, and the second extension layer in a release etch, wherein
the first intrinsic stress causes the first extension layer to deflect in a first direction during the release etch, and
the second intrinsic stress causes the second extension layer to deflect in a second direction during the release etch, the second direction different from the first direction.

30. The method of claim 29, wherein forming comb fingers in the plurality of trenches comprises:
depositing an insulating layer on sidewalls and bottoms of the plurality of trenches; and
depositing a conductive material in the trenches.

31. The method of claim 30, wherein forming the membrane connected to the first subset of the comb fingers comprises:
depositing the conductive material on a flat portion of the substrate during a same deposition step as depositing the conductive material in the trenches; and
patterning the conductive material on the flat portion of the substrate to form the membrane.

32. The method of claim 29, wherein
forming the first extension layer and forming the second extension layer comprise:
depositing a first insulating layer,
patterning the first insulating layer with a first pattern,
depositing a first conducting layer,
depositing a second insulating layer, and patterning the second insulating layer with a second pattern, the second pattern different from the first pattern.

* * * * *